United States Patent
Cho

(10) Patent No.: US 6,806,574 B2
(45) Date of Patent: Oct. 19, 2004

(54) SEMICONDUCTOR DEVICE HAVING MULTILEVEL INTERCONNECTIONS AND METHOD OF MANUFACTURING THE SAME

(75) Inventor: Tai-heui Cho, Suwon (KR)

(73) Assignee: Samsung Electronics Co., Ltd. (KR)

( * ) Notice: Subject to any disclaimer, the term of this patent is extended or adjusted under 35 U.S.C. 154(b) by 41 days.

(21) Appl. No.: 10/062,708

(22) Filed: Jan. 31, 2002

(65) Prior Publication Data
US 2002/0185740 A1 Dec. 12, 2002

(30) Foreign Application Priority Data
Jun. 7, 2001 (KR) ........................................ 2001-31700

(51) Int. Cl.[7] .................... H01L 23/48; H01L 23/52; H01L 29/40
(52) U.S. Cl. ........................................ 257/758; 257/763
(58) Field of Search ................................. 257/758, 763, 257/765

(56) References Cited

U.S. PATENT DOCUMENTS

| | | | |
|---|---|---|---|
| 4,833,519 A | * 5/1989 | Kawano et al. | 257/752 |
| 5,244,534 A | 9/1993 | Yu et al. | 156/636 |
| 5,286,675 A | * 2/1994 | Chen et al. | 438/624 |
| 5,380,679 A | * 1/1995 | Kano | 438/628 |
| 5,817,574 A | * 10/1998 | Gardner | 438/637 |
| 6,105,272 A | 8/2000 | Morgan | 34/63 |
| 6,153,512 A | * 11/2000 | Chang et al. | 438/624 |
| 6,281,541 B1 | * 8/2001 | Hu | 257/306 |
| 6,400,031 B1 | * 6/2002 | Harada | 257/776 |
| 6,503,827 B1 | * 1/2003 | Bombardier et al. | 438/631 |
| 2001/0013615 A1 | * 8/2001 | Lee et al. | 257/296 |

FOREIGN PATENT DOCUMENTS

KR  0060919  7/1999  ............ 21/28

* cited by examiner

Primary Examiner—Phat X. Cao
(74) Attorney, Agent, or Firm—Mills & Onello, LLP

(57) ABSTRACT

In a semiconductor device capable of reducing an electromigration occurring in multilevel interconnections of a high-speed integrated circuit and a method of manufacturing the same, a contact stud is composed of a first portion penetrating an intermetal insulating film and a second portion protruding above the intermetal insulating film. The second portion has vertical sidewalls that are extended vertically with respect to the main surface of the semiconductor substrate and an upper surface that is extended parallel to the main surface. The vertical sidewalls and upper surface are entirely covered with the second metal interconnection layer. Also, in the method of fabricating a semiconductor device including multilevel interconnections, a hard mask pattern is formed on an intermetal insulating film. Then, a via hole is formed to penetrate the intermetal insulating film by etching a portion of the exposed intermetal insulating film. Next, a contact stud composed of a first portion filling the via hole and a second portion, which fills the upper hole and having vertical sidewalls that are extended vertically with respect to the main surface of the semiconductor substrate and an upper surface that is extended parallel to the main surface, is formed. Thereafter, the hard mask pattern is removed and then, a second metal interconnection layer covering the vertical sidewalls and upper surface of the second portion of the contact stud is formed.

24 Claims, 8 Drawing Sheets

SEMICONDUCTOR DEVICE HAVING MULTILEVEL INTERCONNECTIONS AND METHOD OF MANUFACTURING THE SAME

BACKGROUND OF THE INVENTION

1. Field of the Invention

The present invention relates to a semiconductor device and a method of manufacturing the same, and more particularly, to a semiconductor device capable of reducing electromigration occurring in multilevel interconnections of a high-speed integrated circuit that has a small-sized feature according to submicron design rules, and a method of manufacturing the same.

2. Description of the Related Art

As semiconductor devices are becoming more highly integrated, there is an increase in a need for multilevel interconnections. In the event that a multilevel interconnection structure is adopted in a highly integrated semiconductor memory device, thick interlayer insulating films are interposed between interconnections in order to minimize parasitic capacitance between the interconnections. As a result, in the multilevel interconnections having such thick interlayer insulating films, contacts or vias are formed to have a large aspect ratio for electrically connecting interconnection layers that are formed to have feature sizes according to submicron design rules and that are placed above and below the interlayer insulating films.

There are means by which the resistivity of a conductive pattern can be reduced in order to increase a control speed in a highly integrated semiconductor device having multilevel interconnections. In the past, a semiconductor device was manufactured mainly using aluminum for forming multilevel interconnection vias because aluminum is comparatively inexpensive, has a low resistivity, and can be easily etched. However, in this case, as the size of holes for forming vias became scaled-down to a submicron level, step coverage became inadequate using aluminum. To solve these problems, a metal interconnection layer can be formed of aluminum, and a via, which electrically connects metal interconnection layers placed in different levels, can be formed of tungsten w which is deposited by a chemical vapor deposition (CVD) method. However, in this case, some problems may occur. That is, electromigration occurs in an aluminum interconnection layer which is adjacent to the vias made of tungsten. Electromigration is a phenomenon whereby conductive ions such as aluminum ions move in the direction of electric current flow. Due to electromigration, a void is formed on an aluminum interconnection layer which is adjacent to the via and has a low electric potential. As the size of the void is increased, the interconnections are eventually disconnected. Further, when the void is formed on one end of the via, an electric current flowing through the aluminum interconnection layer is increased or the operational temperature of the semiconductor device is raised. In view of this, there is a higher probability that interconnections are disconnected, and thus, the semiconductor device malfunctions. Also, a contraction in the width of an interconnection results in an increase in the amount of electric current flowing through the interconnection, and electromigration is thus worsened, thereby increasing the likelihood of disconnecting the interconnections.

SUMMARY OF THE INVENTION

To address the above limitations, a first objective of the present invention is to provide a semiconductor device having multilevel interconnections, which is capable of reducing electromigration.

A second objective of the present invention is to provide a method of manufacturing a semiconductor device having multilevel interconnections and capable of reducing electromigration.

Accordingly, to achieve the first objective, there is provided a semiconductor device including multilevel interconnections. In the semiconductor device, a first metal interconnection layer is formed on a semiconductor substrate. A second metal interconnection layer is formed on the first metal interconnection layer. An intermetal insulating film is interposed between the first and second metal interconnection layers. The first and second metal interconnection layers are electrically connected with each other by a contact stud. The contact stud is composed of a first portion penetrating the intermetal insulating film and a second portion protruding above the intermetal insulating film. The second portion has vertical sidewalls that are extended vertically with respect to the main surface of the semiconductor substrate and an upper surface that is extended parallel to the main surface, and the vertical sidewalls and upper surface are entirely covered with the second metal interconnection layer.

The first metal interconnection layer may be formed of one of aluminum and an aluminum alloy and the second metal interconnection layer may be formed of one of aluminum and an aluminum alloy. The contact stud may be formed of tungsten w.

The semiconductor device according to the present invention may further include an adhesive layer interposed between the second portion of the constant stud and the second metal interconnection layer. The adhesive layer may be formed of TiN.

The semiconductor device according to the present invention may further include a barrier film interposed between the first portion of the contact stud and the intermetal insulating film. The barrier film may be formed of Ti/Tin.

The intermetal insulating film may be formed of an oxide film or formed to have a multi-layered structure of a silicon oxide film, a fluorinated silica glass (FSG) film, and a silicon oxide film that are sequentially deposited.

To achieve the second objective of the present invention, there is a provided a method of manufacturing a semiconductor device including multilevel interconnections as the first aspect of the present invention. In the method, a first metal interconnection layer is formed on a semiconductor substrate. Then, an intermetal insulating film is formed on the first metal interconnection layer. Next, a hard mask pattern having vertical sidewalls, which extend vertically with respect to the main surface of the semiconductor substrate, is formed on the intermetal insulating film in order to define an upper hole exposing a portion of the intermetal insulating film. Then, a via hole penetrating the intermetal insulating film is formed by etching a portion of the exposed intermetal insulating film. Next, a contact stud composed of a first portion filling the via hole and a second portion, which fills the upper hole and has vertical sidewalls that are extended vertically with respect to the main surface of the semiconductor substrate and an upper surface that is extended parallel to the main surface, is formed. Thereafter, the hard mask pattern is removed, and a second metal interconnection layer covering the vertical sidewalls and upper surface of the second portion of the contact stud is formed.

The hard mask pattern may be formed of a silicon nitride film.

When forming the contact stud comprises, a metal film entirely filling the via hole and the upper hole is formed and the metal film except for the portion filling the via hole and the upper hole is removed.

To remove the metal film, an etchback or chemical mechanical polishing (CMP) method can be used.

Removing the hard mask pattern includes exposing the vertical sidewalls of the second portion of the contact stud and can be performed by a wet etching method.

When forming the second metal interconnection layer, a metal film covering the vertical sidewalls and upper surface of the second portion of the contact stud are deposited, the metal film through a heat treatment is reflowed and the reflowed metal film is patterned.

The vertical sidewalls of the second portion of the contact stud are formed to face the vertical sidewalls of the hard mask pattern when forming the contact stud.

When forming the contact stud, a barrier film covering the inner walls of the via hole and the vertical sidewalls and upper surface of the hard mask pattern is formed, a metal film is formed to completely fill the via hole and upper hole that are defined by the barrier film, the barrier film that covers the upper surface of the hard mask pattern is exposed by removing the metal film except for the portion filling the via hole and the upper hole and the hard mask pattern is exposed by removing the exposed barrier film.

After removing the hard mask pattern, the barrier film exposed on the vertical sidewalls of the second portion of the contact stud can be further removed after removing the hard mask pattern.

Before forming the second metal interconnection layer, an adhesive layer covering the vertical sidewalls and upper surface of the second portion of the contact stud can be further formed. At this time, the second metal interconnection layer is formed on the adhesive layer.

The method can further include forming a capping layer on the second metal interconnection layer in order to suppress electromigration in the second metal interconnection layer, and forming an anti-reflection film on the first metal interconnection layer before forming the intermetal insulating film.

To achieve the second objective, there is also provided a method of manufacturing a semiconductor device including multilevel interconnections as in the second aspect of the present invention. In this method, a first metal interconnection layer is formed on a semiconductor substrate and then, a first insulating film is formed on the first metal interconnection layer. Thereafter, a second insulating film pattern, which is composed of a different substance from the first insulating film and having vertical sidewalls for defining the upper hole, is formed on the first insulating film. Next, a first insulating film pattern for defining the via hole is formed by etching the first insulating film using the second insulating film pattern as a hard mask pattern. Then, a contact stud formed in the via hole and the upper hole and having vertical sidewalls facing the vertical sidewalls of the second insulating film pattern is formed. Thereafter, the vertical sidewalls of the contact stud is exposed by removing the second insulating film pattern. Lastly, a second metal interconnection layer covering the exposed vertical sidewalls of the contact stud is formed.

Also, to achieve the second objective, there is provided a method of manufacturing a semiconductor device including multilevel interconnections as a third aspect of the present invention. In this method, a first metal interconnection layer is formed on the semiconductor substrate, and then, an insulating film is formed on the first metal interconnection layer. Next, a sacrificial layer pattern for defining the upper hole, which exposes a portion of the insulating film, is formed on the insulating film. Then, a portion of the exposed insulating film is etched so that a via hole penetrating the insulating film is formed. Thereafter, a contact stud composed of a first portion completely filling the via hole and a second portion completely filling the upper hole is formed. Then, the sacrificial layer pattern is removed to expose the sidewalls of the second portion. Finally, a second metal interconnection layer completely covering the sidewalls and upper surface of the second portion of the contact stud is formed.

According to the present invention, the second portion, which protrudes above the intermetal insulating film in the contact stud, has vertical sidewalls that are extended vertically with respect to the main surface of the semiconductor substrate and has an upper surface that is extended parallel to the main surface of the semiconductor substrate. The vertical sidewalls and upper surface are entirely covered with the second metal interconnection layer. Therefore, the contact area between the contact stud and the second metal interconnection layer is larger, thereby reducing contact resistance. Further, the probability that a void is formed around the contact stud due to electromigration is lower and the life time of the interconnection can be extended.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF PREFERRED EMBODIMENTS

Figure 1:
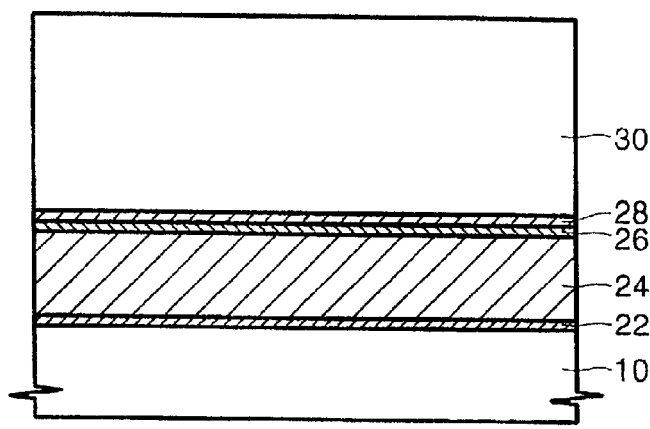
FIGS. 1 through 12 are cross-sectional views illustrating a method of manufacturing a semiconductor device including multilevel interconnections according to an embodiment of the present invention.

The present invention will be now described more fully with reference to the accompanying drawings, in which preferred embodiments of the invention are shown. The invention may, however, be embodied in many different forms and should not be construed as being defined to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, an thus their description will be omitted.

FIGS. 1 through 12 are cross-sectional views illustrating a method of manufacturing a semiconductor device including multilevel interconnections according to an embodiment of the present invention.

Referring to FIG. 1, a TiN film 22 is formed to a thickness of 100–300 Å on a semiconductor substrate 10 and then, a first metal interconnection layer 24 is formed of aluminum or aluminum alloy to a thickness of about 5000–7000 Å on the TiN film 22.

Next, a Ti film 26 is formed to have about 100–200 Å thickness on the first metal interconnection layer 24, and a anti-reflection film 28 is formed to a thickness of about 500–900 Å on the Ti film 26.

Thereafter, an intermetal insulating film 30 is formed to a thickness of about 6000–8000 Å on the anti-reflection film 28. The intermetal insulating film 30 is formed of an oxide film. It is preferable that the intermetal insulating film 30 has a multi-layered structure by sequentially depositing a silicon oxide film, a fluorinated silica glass film (FSG) film, and a silicon oxide film. A plasma-enhanced tetraethyl orthosilicate (PE-TEOS) film can be used as the silicon oxide film constituting the intermetal insulating film 30 having the above multi-layered structure.

Figure 2:
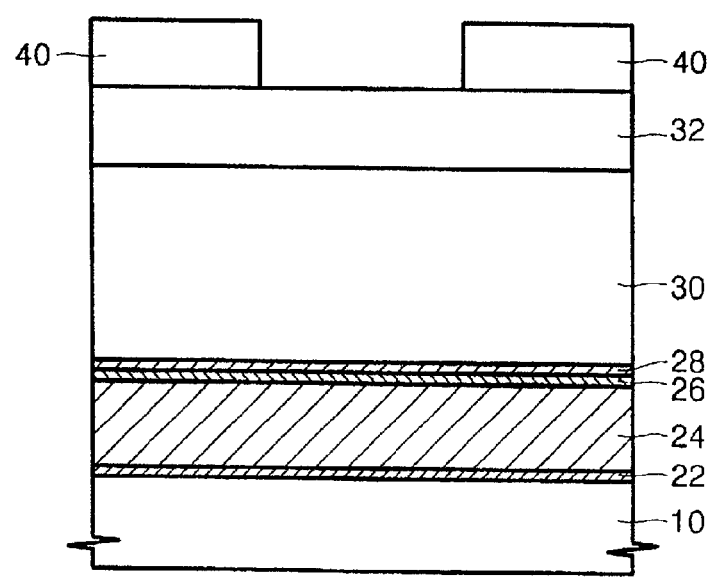

Referring to FIG. 2, a sacrificial layer 32 is formed to a thickness of about 1000–2000 Å on the intermetal insulating film 30. The sacrificial layer 32 is to be removed by a wet etching method during a subsequent process. The thickness of sacrificial layer 32 depends on the thickness of a portion that projects above on the intermetal insulating film 30 to form contact studs in a subsequent process. A description of the sacrificial layer 32 will be explained in detail below.

Peripheral films may wear off when the sacrificial layer 32 is removed through the wet etching method. In this case, this problem can be addressed by forming the sacrificial layer 32 of a substance that has a sufficient etching selectivity with regard to both the intermetal insulating film 30 and a tungsten film that will be formed during a subsequent process. It is preferable that the sacrificial layer 32 is formed of a silicon nitride film by a low-temperature deposition method, i.e. below 400° C. For this reason, it is preferable that a plasma deposition method that can be performed at a low temperature is adopted when forming the sacrificial layer 32 of a silicon nitride film. In order to pattern the sacrificial layer 32, a photoresist pattern 40 that exposes a portion of the upper surface of the sacrificial layer 32 is formed on the sacrificial layer 32.

Figure 3:
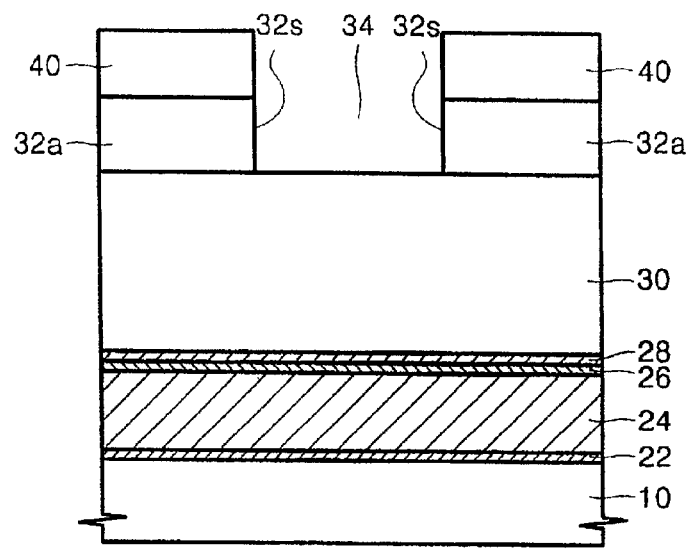

Referring to FIG. 3, the exposed portion of the sacrificial layer 32 is etched, using the photoresist pattern 40 as an etching mask, to form a sacrificial layer pattern 32a having vertical sidewalls 32s extended vertically with respect to the main surface of the semiconductor substrate 10. As a result, an upper hole 34 defined by the vertical sidewalls 32s of the sacrificial layer pattern 32a is formed, and an upper surface of the intermetal insulating film 30 is exposed through the upper hole 34.

Figure 4:
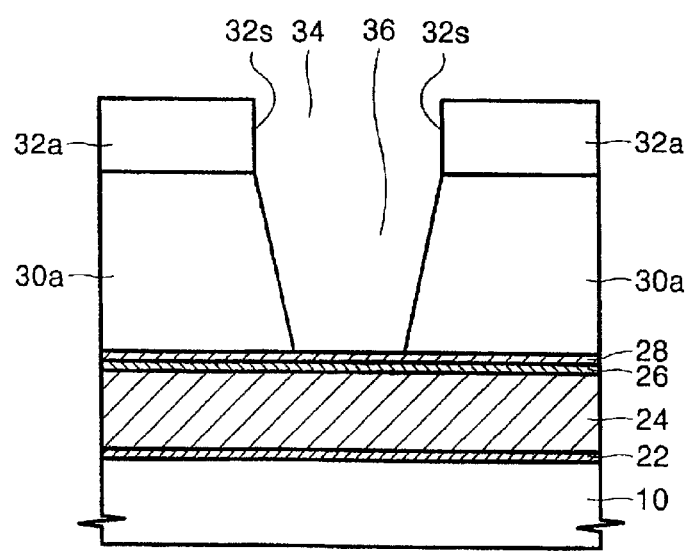

Referring to FIG. 4, the intermetal insulating film 30 is etched using the photoresist pattern 40 as an etching mask until the anti-reflection film 28 is exposed, thus forming a via hole 36 penetrating the intermetal insulating film 30. Then the photoresist pattern 40 is removed so that an intermetal insulating film pattern 30a defining the via hole 36 is formed, and the anti-reflection film 28 is exposed through the via hole 36. As the aspect ratio of the via hole 36 becomes bigger, a sidewalls of the intermetal insulating film pattern 30a which defines the via hole 36 are formed to have inclined surfaces as shown in FIG. 4.

Here, the via hole 36 is formed by using the photoresist pattern 40 as an etching mask; however, it can also be formed by etching the intermetal insulating film 30 using the sacrificial layer pattern 32a as a hard mask. In this case, once the sacrificial layer pattern 32a is formed, the photoresist pattern 40 can be removed before the via hole 36 is formed.

Figure 5:
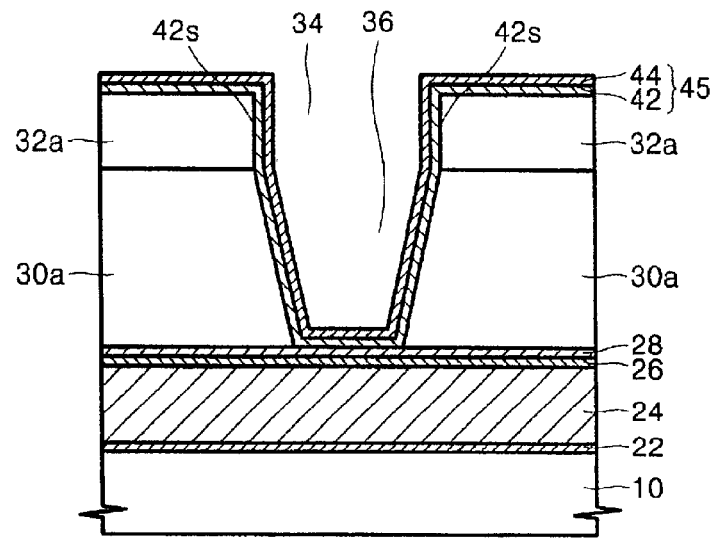

Referring to FIG. 5, a barrier film 45 is formed to covers the inner walls of the via hole 36 and the vertical sidewalls 32s and upper surface of the sacrificial layer pattern 32a. For instance, the barrier film 45 is formed to have an accumulation structure by sequentially depositing a Ti Film 42 having a thickness of about 100 Å and a TiN film 44 having a thickness of about 700 Å. As a result, the Ti film 42 constituting the barrier film 45 has vertical sidewalls 42s facing the vertical sidewalls 32s of the sacrificial layer pattern 32a and extended vertically with respect to the main surface of the semiconductor substrate 10.

Figure 6:
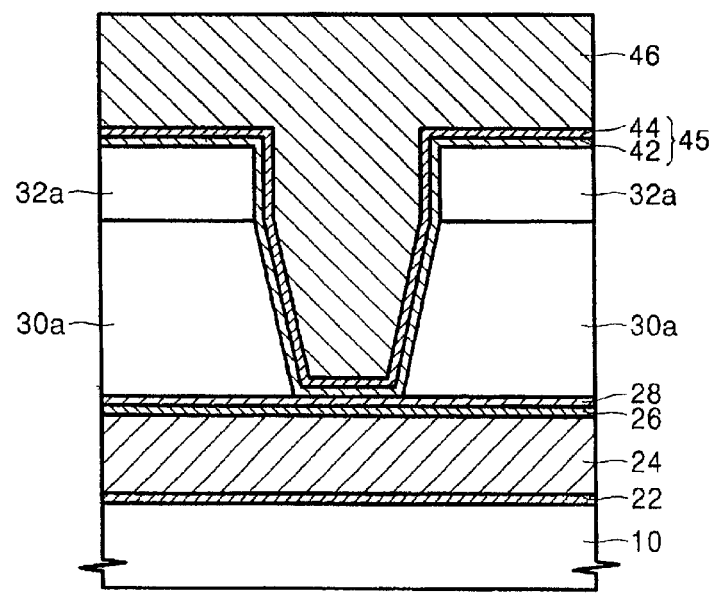

Referring to FIG. 6, a metal film 46 that completely fills the via hole 36 and the upper hole 34 defined by the barrier film 45 is formed. The metal film 46 can be formed of tungsten W. At this time, tungsten is deposited by a chemical vapor deposition (CVD) method using a $WF_6$ gas as a tungsten source.

Figure 7:
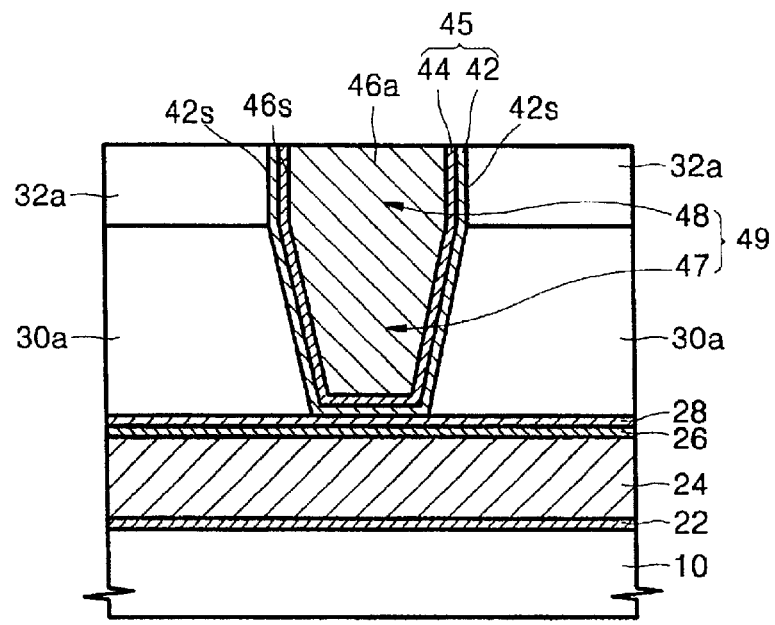

Referring to FIG. 7, the metal film 46, except for the portion filling the via hole 36 and the upper hole 34, is removed through an etchback or a CMP method thereby obtaining a metal film pattern 46a that completely fills the via hole 36 and the upper hole 34. At this time, the barrier film 45 on the upper surface of the sacrificial layer pattern 32a is removed.

Here, when the metal film 46 is removed through the etchback method, the barrier film 45 covering the upper surface of the sacrificial layer pattern 32a can be removed at the same time. Otherwise, the metal film 46 can be removed by performing a two-step process, i.e. (i) the metal film 46 is removed using the barrier film 45 as an etch stopper and (ii) the barrier film 45 covering the upper surface of the sacrificial layer pattern 32s is etched back through an etching process by means of an etching gas which can minimize the wear on the metal film 46. In the meantime, in the event that the CMP method is adopted, both the barrier film 45 and the remaining portion of the metal film 46 can be removed using the sacrificial layer pattern 32a as an etch stopper so that the upper surface of the sacrificial layer pattern 32a is exposed. As described above, if the barrier film 45 covering the upper surface of the sacrificial layer pattern 32a is removed by one of these methods, a desired etching result can be achieved, although the thickness of the photoresist pattern, which is used as an etching mask during the subsequent photolithography process, at which time an intermetal layer is formed, is formed to be comparatively thin.

If the metal film 46, except for the portion filling the via hole 36 and the upper hole 34, and the exposed portion of the barrier film 45 are removed, a contact stud 49 being composed of the metal film pattern 46a and the barrier film 45 is formed. Here, the metal film pattern 46a has vertical sidewalls 46s, which extend vertically with respect to the main surface of the semiconductor substrate 10 and face the vertical sidewalls 32s of the sacrificial layer pattern 32a.

The contact stud 49 is divided into two portions, i.e. a first portion 47 filling the via hole 36 and a second portion 48 filling the upper hole 34. The second portion 48 has the vertical sidewalls 42s formed by the Ti film 42 which constitutes the barrier film 45.

Figure 8:
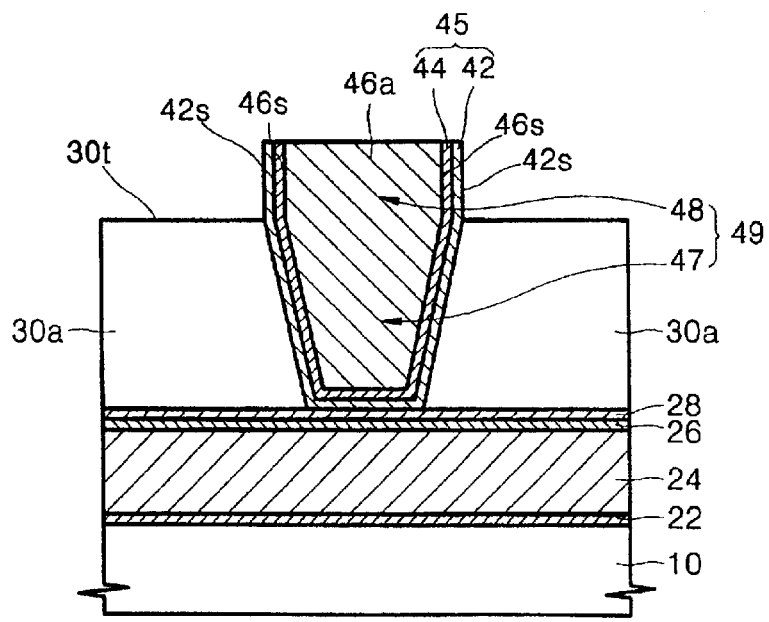

Referring to FIG. 8, the second portion 48 of the contact stud 49 is exposed by removing the sacrificial layer pattern 32a using the wet etching method. At this time, if the sacrificial layer pattern 32a is formed of a silicon nitride film, it can be removed by a wet-etching method that uses $H_3PO_4$ without etching the intermetal insulating film pattern 30a and the metal film pattern 46a. Consequently, an upper surface 30t of the intermetal insulating film pattern 30a and the vertical sidewalls 46s and upper surface of the second portion 48 can be completely exposed while the second portion 48 is made to protrude above the intermetal insulating film pattern 30a. As described above with regard to FIG. 2, the thickness of the second portion 48, which is formed on a higher position than the intermetal insulating film pattern 30a, can be controlled by controlling the thickness of the sacrificial layer 32.

Figure 9:
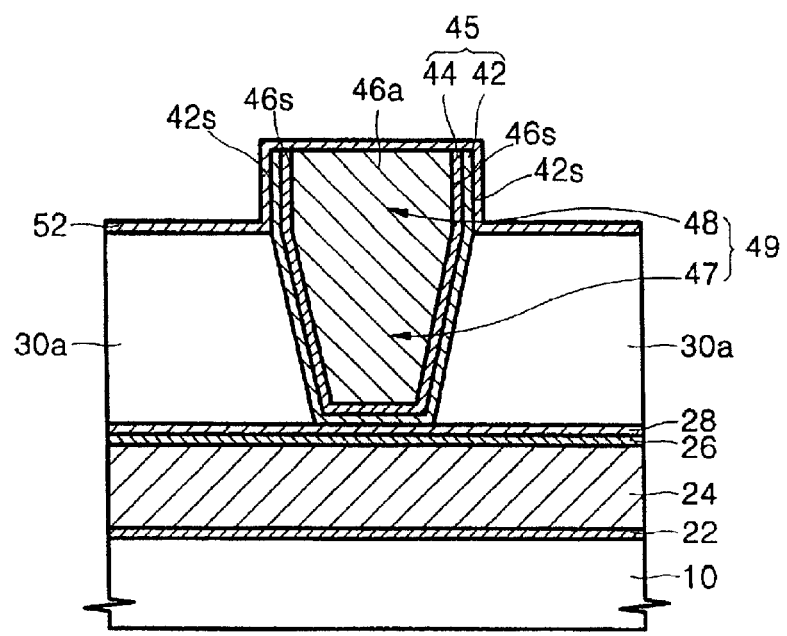

Referring to FIG. 9, an adhesive layer 52, which completely covers the vertical sidewalls 42s and upper surface of the second portion 48, is formed on the resultant structure where the second portion 48 of the contact stud 49 is exposed. The adhesive layer 52 can be formed of a TiN film having a thickness of about 100–400 Å.

Figure 10:
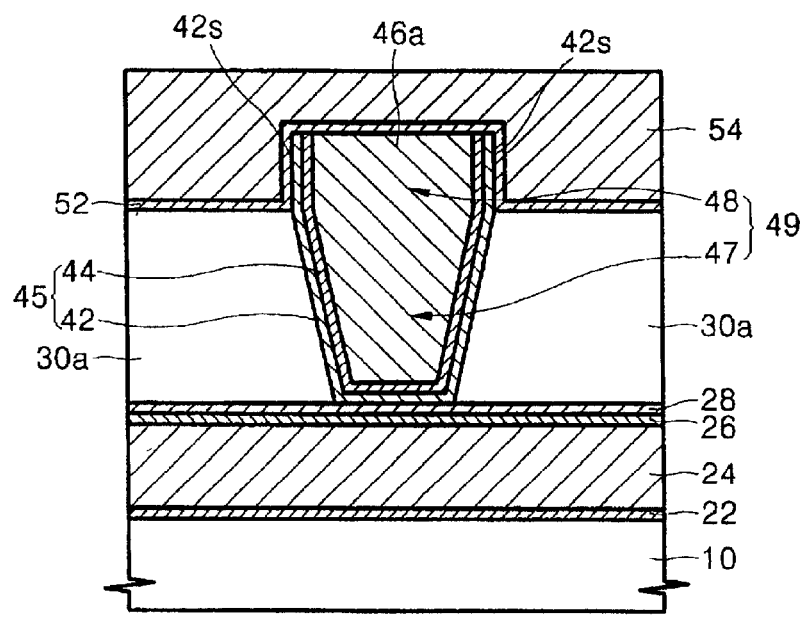

Referring to FIG. 10, a second metal interconnection layer 54 having a flat upper surface is formed on the adhesive layer 52. The second metal interconnection layer 54 is formed of aluminum or aluminum alloy. In order to form the second metal interconnection layer 54, a metal film is first formed of aluminum or aluminum alloy by performing a sputtering process, at which time it is preferable that the aluminum film or aluminum alloy film is formed at a low temperature of below 200° C. If the aluminum film or aluminum alloy film is formed below 200° C., a dense film having smooth surface morphology can be obtained. Next, the upper surface of the aluminum film or aluminum alloy film is flattened by reflowing the aluminum film or aluminum alloy film by a heat treatment at about 350–500° C. As a result, the second metal interconnection layer 54 having a flat upper surface is formed. The second metal interconnection layer 54 is formed to completely cover the second portion 48 of the contact stud 49 such that the vertical sidewalls 42s and upper surface of the second portion 48 are entirely covered by the second metal interconnection layer 54 while the adhesive layer 52 is interposed therebetween.

Figure 11:
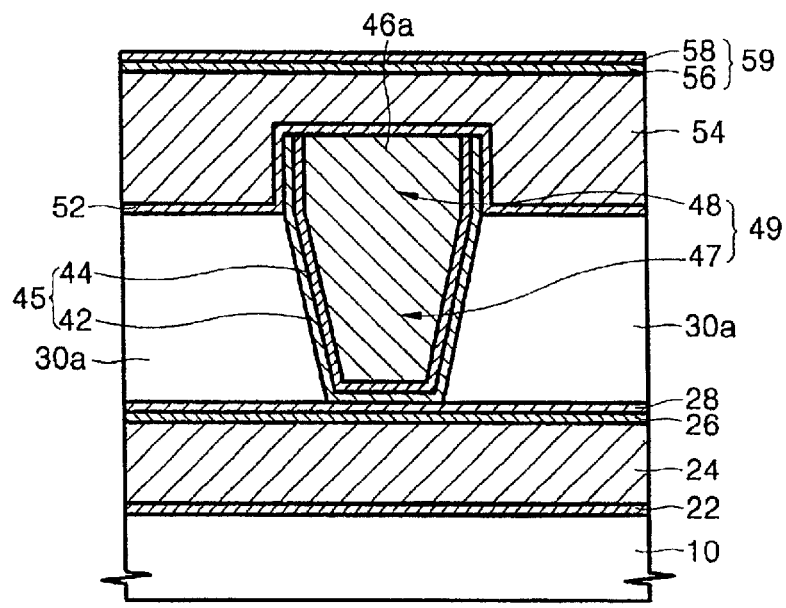

Referring to FIG. 11, a capping layer 59 is formed on the second metal interconnection layer 45 having a flat upper surface. The capping layer 59 prevents a void from being formed by suppressing electromigration in the second metal interconnection layer 54 and can be formed, for example, of a Ti film 56 having a thickness of about 100–200 Å and a TiN film 58 having a thickness of about 300–400 Å.

Figure 12:
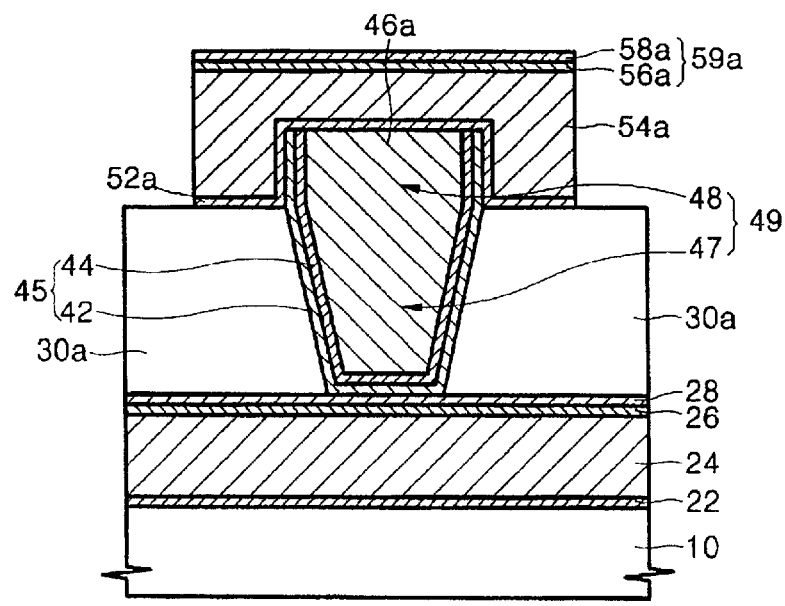

Referring to FIG. 12, the capping layer 59, the second metal interconnection layer 54 and the adhesive layer 52 are patterned through a photolithography process and as a result, an adhesive layer pattern 52a, a second metal interconnection layer pattern 54a and a capping layer pattern 59a are formed. The capping layer pattern 59a is formed of a Ti film pattern 56a and a TiN film pattern 58a.

As described above with regard to FIG. 7, the barrier film 45 covering the upper surface of the sacrificial layer pattern 34a is removed at the same time with the removal of the remaining portion of the metal film 46, except for the portion filling the via hole 36 and the upper hole 34. Therefore, the barrier film 45 does not remain on the upper portion of the intermetal insulating film pattern 30a as in the resultant structure shown in FIG. 11. For this reason, the thickness of the photoresist pattern (not shown) can be reduced during an etching process by the photolithography process because the thickness of the barrier film 45 is removed. Consequently, a process margin can be secured during the photolithography process for forming a metal interconnection.

As shown in FIG. 12, the contact stud 49 is composed of the first portion 47 penetrating the intermetal insulating film pattern 30a and the second portion 48 protruding above the intermetal insulating film pattern 30a. The vertical sidewalls of the second portion 48 is formed of the sidewalls 42s of the Ti film 42 extending vertically with respect to the main surface of the semiconductor substrate 10, and the upper surface of the second portion 48 is extended parallel to the main surface of the semiconductor substrate 10. The second portion 48 of the contact stud 49 is entirely covered with the second metal interconnection pattern 54a, and its vertical sidewalls and upper surface are thus completely covered with the second metal interconnection layer pattern 54a. Accordingly, a contact area between the contact stud 49 and the second metal interconnection layer pattern 54a is increased, thereby reducing contact resistance. Further, since the second metal interconnection layer 54a is configured to encompass the second portion 48 of the contact stud 49, the current density in the upper portion of the contact stud 49 becomes low in comparison to that in the lower portion when a constant electric current flows through the first metal interconnection layer 24, the contact stud 49 and the second metal interconnection layer pattern 54a, and the probability that a void is formed around the contact stud 49 due to electromigration is comparatively low. Also, even if a void is formed around the contact stud 49, the contact area between the contact stud 49 and the second metal interconnection layer pattern 54a is larger, so an increase in resistance due to the void becomes comparatively low. Therefore, an interconnection is not completely disconnected in spite of the void formed around the contact stud 49.

Also, generally, as an acute angle is formed between the upper surface of the intermetal insulating film 30 and the vertical sidewalls of the contact stud 49, a void may be formed around the contact stud 49 on the intermetal insulating film 30 when an upper metal interconnection layer is formed on the intermetal insulating film 30a. However, according to this embodiment, the vertical sidewalls of the second portion 48 extend vertically with respect to the main surface of the semiconductor substrate 10 and thus, no voids are formed around the second portion 48 on the intermetal insulating film pattern 30a when the second metal interconnection layer 54 is formed.

Figure 13:
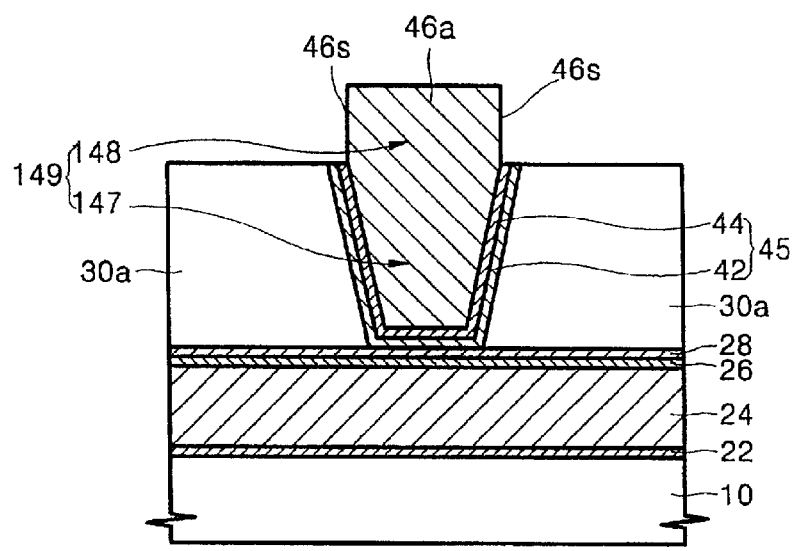
FIGS. 13 through 15 are cross-sectional views illustrating a method of manufacturing a semiconductor device including multilevel interconnections according to another embodiment of the present invention.
Figure 14:
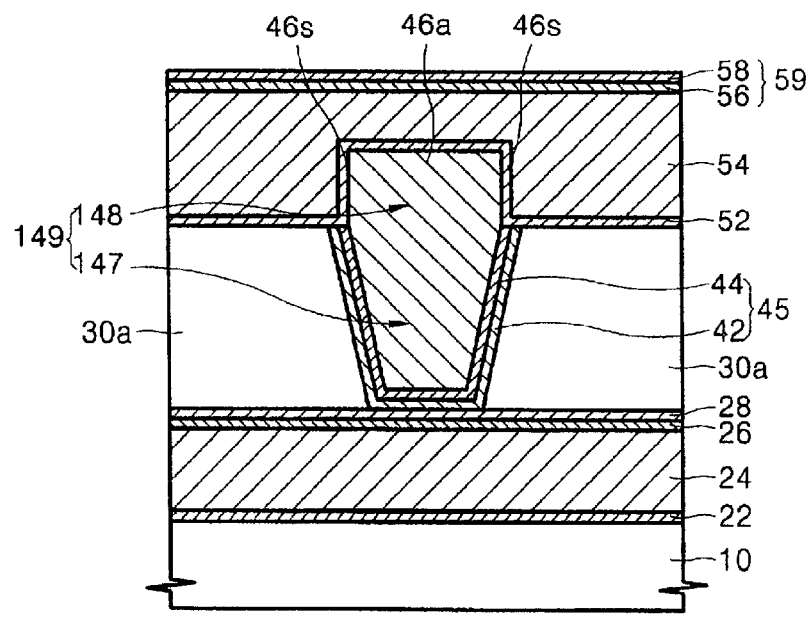
Figure 15:
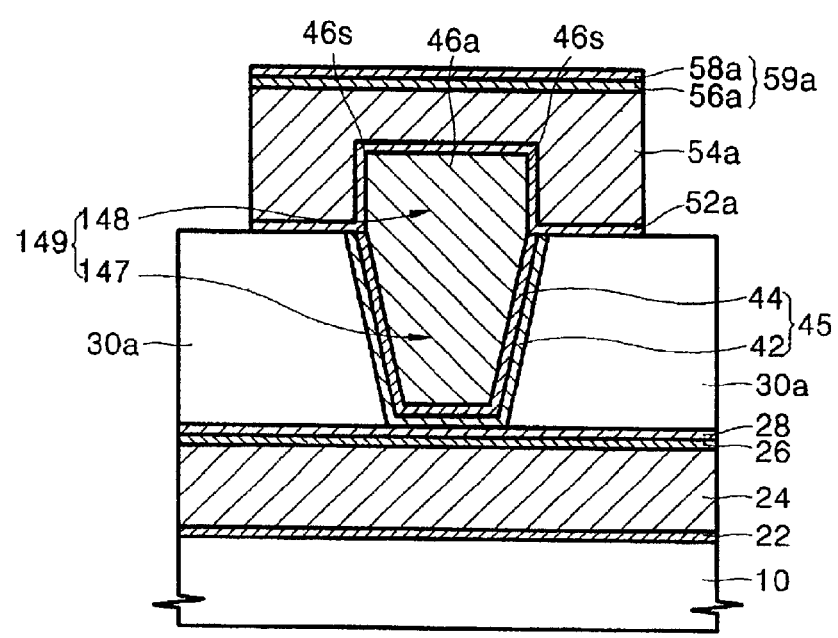

FIGS. 13 through 15 are cross-sectional views illustrating a method of manufacturing a semiconductor device having multilevel interconnections according to another embodiment of the present invention. In FIGS. 13 through 15, elements corresponding to those explained in FIGS. 1 through 12 are denoted by the same reference numerals, and their detailed descriptions will be thus omitted. In another embodiment of the present invention, a contact stud 149 is formed by the same method as the method explained with reference to FIGS. 1 through 8, except that the vertical sidewalls of a second portion 148 of the contact stud 149 are formed by the vertical sidewalls 46s of the metal film pattern 46a removing the barrier film 45 that is exposed on the vertical sidewalls 46s of the metal film pattern 46a after the sacrificial layer pattern 32a is removed as shown in FIG. 13. That is, the contact stud 149 is composed of a first portion 147 penetrating the intermetal insulating film pattern 30a and the second portion 148 protruding above the intermetal insulating film pattern 30a.

Referring to FIG. 14, the adhesive layer 52, the second metal interconnection layer 54 and the capping layer 59 are formed by the same method as the method explained with reference to FIGS. 9 through 11.

Referring to FIG. 15, an adhesive layer pattern 52a, a second metal interconnection layer pattern 54a and a capping layer pattern 59a are formed by patterning the adhesive layer 52, the second metal interconnection layer 54 and the capping layer 59 by the same method as the method explained with reference to FIG. 12.

As shown in FIG. 15, the contact stud 149 is composed of the first portion 147 penetrating the intermetal insulating film pattern 30a and the second portion 148 protruding above the intermetal insulating film pattern 30a. The vertical sidewalls of the second portion 148 is formed by the vertical sidewalls 46s of the metal film pattern 46a which extend vertically with respect to the main surface of the semiconductor substrate 10, and the upper surface of the second portion 148 extends parallel to the main surface of the semiconductor substrate 10. The second portion 148 of the contact stud 149 is formed to be entirely covered by the second metal interconnection layer pattern 54a and therefore, its vertical sidewalls and upper surface are entirely covered by the second metal interconnection layer pattern 54a. Therefore, a contact area between the contact stud 149 and the second metal interconnection layer pattern 54a becomes larger, thereby reducing contact resistance. As a result, when a constant electric current flows through the first metal interconnection layer 24, the contact stud 149, and the second metal interconnection layer pattern 54a, the current density in the upper portion of the contact stud 149 is less than that in the lower portion, and the probability that a void is formed around the contact stud 149 due to electromigration is lower. In addition, even if the void is formed around the contact stud 149, the contact area between the contact stud 149 and the second metal interconnection layer pattern 54a becomes larger, and an increase in resistance due to the void becomes comparatively low. Accordingly, an interconnection can be prevented from being completely disconnected.

As described above, in the semiconductor device including multilevel interconnections according to the present invention, the contact stud, which electrically connects the first and second metal interconnection layers, which are placed in different levels, is composed of the first portion penetrating the intermetal insulating film pattern and the second portion protruding above the intermetal insulating film pattern. Also, the second portion has vertical sidewalls that are extended vertically with respect to the main surface of the semiconductor substrate and has an upper surface that is extended parallel to the main surface of the semiconductor substrate. The vertical sidewalls and upper surface are entirely covered with the second metal interconnection layer. Therefore, the contact area between the contact stud and the second metal interconnection layer is larger, thereby reducing contact resistance. When a constant electric current flows through the multilevel interconnections, the current density in the upper portion of the contact stud is less than that in the lower portion, and the probability that a void is formed around the contact stud due to electromigration is lower. In addition, even if the void is formed around the contact stud, the contact area between the contact stud and the second metal interconnection layer pattern becomes larger, and thus an increase in resistance due to the void becomes comparatively low. Accordingly, the complete disconnection of an interconnection can be prevented and the lifetime of the interconnection can be extended even in the event that voids are formed around the contact stud.

Further, in a method of manufacturing a semiconductor device including multilevel interconnections according to the present invention, in order to form a contact stud having the above-described structure, a sacrificial layer pattern having a predetermined thickness that can be used as a hard mask is formed on the intermetal insulating film, and a via hole that penetrates the intermetal insulating film is formed. Then, a metal substance is filled in the via hole and the upper hole, thus forming a contact stud composed of a first portion, which completely fills the via hole, and a second portion, which fills completely the upper hole and has sidewalls tat are vertical. Next, the sacrificial layer pattern is removed. At this time, the thickness of the second portion, which protrudes above the intermetal insulating film, can be controlled by controlling the thickness of the sacrificial layer pattern. Therefore, the contact area between the contact stud and the second metal interconnection layer can be also controlled.

As described above, while the present invention has been particularly shown and described with reference to the preferred embodiments thereof, the present invention is not restricted to the above embodiments. It must be understood by those skilled in the art that various changes in form and details may be made without departing from the spirit and scope of the invention as defined by the appended claims.

What is claimed is:

1. A semiconductor device including multilevel interconnections, comprising:

a first metal interconnection layer formed on a semiconductor substrate;

a second metal interconnection layer formed on the first metal interconnection layer;

an intermetal insulating film interposed between the first and second metal interconnection layers;

a contact stud for electrically connecting the first and second metal interconnection layers, wherein the contact stud is composed of a first portion penetrating the intermetal insulating film and a second portion protruding above the intermetal insulating film, the second portion having vertical sidewalls that extend vertically with respect to the semiconductor substrate and an upper surface that is extended parallel to the semiconductor substrate, and wherein the vertical sidewalls and upper surface of the second portion of the contact stud are entirely covered by the second metal interconnection layer;

an adhesive layer interposed between the vertical sidewalls and the upper surface of the second portion of the contact stud and the second metal interconnection layer; and a barrier film interposed between the first portion of the contact stud and the intermetal insulating film and between the vertical sidewalls of the contact stud and the adhesive layer, wherein the upper surface of the second portion of the contact stud has a first cross-sectional area that is greater than a second cross-sectional area of a bottom surface of the first portion of the contact stud.

2. The semiconductor device of claim 1, wherein the first metal interconnection layer is formed of one of aluminum and an aluminum alloy.

3. The semiconductor device of claim 1, wherein the second metal interconnection layer is formed of one of aluminum and an aluminum alloy.

4. The semiconductor device of claim 1, wherein the contact stud is formed of tungsten w.

5. The semiconductor device of claim 1, wherein the adhesive layer is formed of TiN.

6. The semiconductor device of claim 1, wherein the barrier film is formed of Ti/TiN.

7. The semiconductor device of claim 1, wherein the intermetal insulating film is formed of an oxide film.

8. The semiconductor device of claim 1, wherein the intermetal insulating film is formed to have a multi-layered structure of a silicon oxide film, a fluorinated silica glass (FSG) film, and a silicon oxide film that are sequentially deposited.

9. The semiconductor device of claim 1, wherein the first portion of the contact stud has non-vertical sidewalls.

10. The semiconductor device of claim 1, wherein the first portion of the contact stud has inclined sidewalls.

11. The semiconductor device of claim 1, wherein the first portion of the contact stud is of a thickness ranging from about 6,000 Å to about 8,000 Å, and wherein the second portion of the contact stud is of a thickness ranging from about 1,000 Å to about 2,000 Å.

12. The semiconductor device of claim 1, wherein the upper surface of the second portion of the contact stud has a width that is greater than a width of the bottom surface of the first portion of the contact stud.

13. A semiconductor device including multilevel interconnections, comprising:
   a first metal interconnection layer formed on a semiconductor substrate;
   a second metal interconnection layer formed on the first metal interconnection layer;
   an intermetal insulating film interposed between the first and second metal interconnection layers;
   a contact stud for electrically connecting the first and second metal interconnection layers,
   wherein the contact stud is composed of a first portion penetrating the intermetal insulating film and a second portion protruding above the intermetal insulating film, the second portion having vertical sidewalls that extend vertically with respect to the semiconductor substrate and an upper surface that is extended parallel to the semiconductor substrate, and wherein the vertical sidewalls and upper surface of the second portion of the contact stud are entirely covered by the second metal interconnection layer;
   an adhesive layer interposed between the vertical sidewalls and the upper surface of the second portion of the contact stud and the second metal interconnection layer; and
   a barrier film interposed between the first portion of the contact stud and the intermetal insulating film and between the vertical sidewalls of the contact stud and the adhesive layer,
   wherein the upper surface of the second portion of the contact stud has a width that is greater than a width of a bottom surface of the first portion of the contact stud.

14. The semiconductor device of claim 13, wherein the first metal interconnection layer is formed of one of aluminum and an aluminum alloy.

15. The semiconductor device of claim 13, wherein the second metal interconnection layer is formed of one of aluminum and an aluminum alloy.

16. The semiconductor device of claim 13, wherein the contact stud is formed of tungsten w.

17. The semiconductor device of claim 13, wherein the adhesive layer is formed of TiN.

18. The semiconductor device of claim 13, wherein the barrier film is formed of Ti/TiN.

19. The semiconductor device of claim 13, wherein the intermetal insulating film is formed of an oxide film.

20. The semiconductor device of claim 13, wherein the intermetal insulating film is formed to have a multi-layered structure of a silicon oxide film, a fluorinated silica glass (FSG) film, and a silicon oxide film that are sequentially deposited.

21. The semiconductor device of claim 13, wherein the first portion of the contact stud has non-vertical sidewalls.

22. The semiconductor device of claim 13, wherein the first portion of the contact stud has inclined sidewalls.

23. The semiconductor device of claim 13, wherein the first portion of the contact stud is of a thickness ranging from about 6,000 Å to about 8,000 Å, and wherein the second portion of the contact stud is of a thickness ranging from about 1,000 Å to about 2,000 Å.

24. The semiconductor device of claim 13, wherein the upper surface of the second portion of the contact stud has a first cross-sectional area that is greater than a second cross-sectional area of a bottom surface of the first portion of the contact stud.

* * * * *